United States Patent [19]

Wallace et al.

[11] Patent Number: 5,352,851

[45] Date of Patent: Oct. 4, 1994

[54] EDGE-MOUNTED, SURFACE-MOUNT INTEGRATED CIRCUIT DEVICE

[75] Inventors: James S. Wallace, Sugarland; Ernie Russell, Richmond; Daniel Baudouin, Missouri City, all of Tex.

[73] Assignee: Texas Instruments Incorporated, Dallas, Tex.

[21] Appl. No.: 941,996

[22] Filed: Sep. 8, 1992

[51] Int. Cl.$^5$ .......................................... H01L 23/02
[52] U.S. Cl. ................................. 174/52.4; 361/764
[58] Field of Search .................. 174/52.4, 52.1, 52.2; 361/760, 764, 772, 773, 774, 775, 776, 719, 723, 740, 741, 742, 743, 756; 257/731, 732, 733, 693, 767, 725, 724; 439/68, 70

[56] References Cited

U.S. PATENT DOCUMENTS

| | | | |
|---|---|---|---|
| 3,868,676 | 2/1975 | Hennessey | 361/400 |
| 3,912,984 | 10/1975 | Lockhart | 361/400 |
| 4,246,627 | 1/1981 | Poensgen | 361/773 |
| 4,710,134 | 12/1987 | Uorunsky | 439/264 |
| 4,807,087 | 2/1989 | Sawaya | 361/773 |
| 4,850,892 | 7/1989 | Clayton et al. | 439/326 |
| 4,866,566 | 9/1989 | Nishiyama | 174/52.2 X |
| 4,888,307 | 12/1989 | Spairisano et al. | 174/52.2 X |
| 4,948,375 | 8/1990 | Lawrence et al. | 439/72 |
| 4,951,176 | 8/1990 | Bergfried et al. | 174/138 D |
| 4,967,262 | 10/1990 | Farnsworth | 357/80 |
| 4,975,763 | 12/1990 | Baudouin et al. | 357/74 |
| 5,043,791 | 8/1991 | Stoues et al. | 257/669 |
| 5,166,570 | 11/1992 | Takahashi | 174/52.4 X |
| 5,288,240 | 2/1994 | Savant | 439/266 |

FOREIGN PATENT DOCUMENTS

| | | |
|---|---|---|
| 3611346 | 10/1987 | Fed. Rep. of Germany . |
| 55-77159 | 6/1980 | Japan . |
| 60-210858 | 10/1985 | Japan . |

Primary Examiner—Leo P. Picard
Assistant Examiner—Christopher Horgan
Attorney, Agent, or Firm—W. James Brady, III; Richard L. Donaldson

[57] ABSTRACT

An edge-mounted integrated circuit device (10) includes a semiconductor die (11) and a lead frame (15) attached to the semiconductor die (11). The lead frame (15) includes a plurality of leads (14) electrically connected to the semiconductor die and lead frame supports (16, 18). A package (12) encapsulates the semiconductor die and a portion of the lead frame (15). The leads (14) extend from the package (12) and are bent to present a face for surface mount connection to conductors on a substrate. The supports (16, 18) extend from the package (12) for contacting the substrate to support the device (10) in position for soldering the leads (14) to conductors on the substrate.

22 Claims, 10 Drawing Sheets

EDGE-MOUNTED, SURFACE-MOUNT INTEGRATED CIRCUIT DEVICE

CROSS-REFERENCE TO RELATED APPLICATIONS

The following coassigned patent applications are hereby incorporated herein by reference:

| Serial No. | Filing Date | TI Case No. |
| --- | --- | --- |
| 1.) 07/168,049 (U.S. Pat. No. 4,975,763) | 12/4/90 | 13359 |
| 2.) 07/578,058 | 9/5/90 | 13359A |
| 3.) 07/868,742 | 4/9/92 | 16138 |

FIELD OF THE INVENTION

This invention generally relates to integrated circuit devices and, more particularly, to edge-mounted, surface--mount integrated circuit devices.

BACKGROUND OF THE INVENTION

A wide variety of packages have been developed to house integrated circuits. Dual-in-line plastic packages, referred to as DIP packages, have been used in the bulk of semiconductor manufacture for many years. DIP packages have leads that are soldered in through-holes in printed circuit (PC) boards for mounting the package on the PC board.

Recently, surface-mount packages have been introduced to eliminate the necessity of soldering leads in holes in PC boards. Surface-mount packages have leads that are soldered to printed circuit conductors on the surface of a printed circuit board. Surface-mount packaging permits the device leads and PC board conductors to be closer together to achieve greater densities than possible with DIP packaged devices.

More recently, edge-mounted, surface-mount packages have been developed in an effort to further increase density, improve cooling and reduce cost. Presently available edge-mounted, surface-mount integrated circuit devices typically include a semiconductor die encapsulated in a plastic package and leads electrically connected to the die and extending from an edge of the packaging material. Plastic supports, integrally formed with the package, extend from the same edge as the leads for insertion into holes in a printed circuit board. The plastic supports, when inserted into the holes, are intended to provide sufficient support to hold the device in the correct vertical orientation until the leads are soldered to printed circuit conductors.

SUMMARY OF THE INVENTION

It has been discovered that a small amount of force, such as that produced by inadvertent bumping, when applied to an edge-mounted, surface-mount integrated circuit device having plastic supports integrally formed with the package often shears the supports from the package. Where the device leads have not yet been soldered to the printed circuit conductors, the device will tip over making it impossible to complete automated manufacture of the circuit board assembly. It has also been discovered that the rigidity of plastic supports makes automated insertion of the support in a hole in a printed circuit board very difficult whenever there is even a slight misalignment between the support and the hole. In addition, the cost of producing the complex molds required for plastic packages having integrally formed supports is significant.

Accordingly, a need exists for an edge-mounted, surface-mount integrated circuit device having supports for holding the device in a vertical position prior to soldering that are not integrally molded with the package and are flexible enough to withstand inadvertent bumping and be easily inserted despite slight misalignments with a PC board hole.

Generally, and in one form of the invention, an edge-mounted integrated circuit device includes a semiconductor die and a lead frame attached to the semiconductor die. The lead frame includes a plurality of leads electrically connected to the semiconductor die and at least one support. A package encapsulates the semiconductor die and a portion of the lead frame. Each of the leads extends from an edge of the package and is bent to present a face for surface-mount connection to a conductor on a substrate. At least one support extends from the package for insertion into an opening in the substrate to support the edge-mounted integrated circuit device in position for soldering the faces of the leads to the conductors on the substrate.

In another form of the invention, an edge-mounted integrated circuit device includes a semiconductor die and a lead frame attached to the semiconductor die. The lead frame includes a plurality of leads electrically connected to the semiconductor die, a first support, and a second support. A package encapsulates the semiconductor die and a portion of the lead frame. Each of the leads extends from a first edge of the package and is bent to present a face for surface-mount connection to a conductor on a substrate. Each of the first and second supports extends from the package and is bent to present a face for contacting the substrate to support the integrated circuit device in position for soldering the faces of the leads to the conductors on the substrate. The first support and the second support are bent in opposing directions.

An advantage of the invention is that formation of the supports is simple, inexpensive, and eliminates the requirement of a complex package mold. Other advantages include the fact that since lead frame material is used to form the supports, the supports are sufficiently resilient to easily withstand the force of inadvertent bumping without breaking off and flexible enough to deform slightly to permit insertion in circuit board holes in situations where there is slight support and hole misalignment. In addition, the supports act as heat radiators by conducting heat from the interior of the plastic package encapsulating the die to the exterior.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1A:
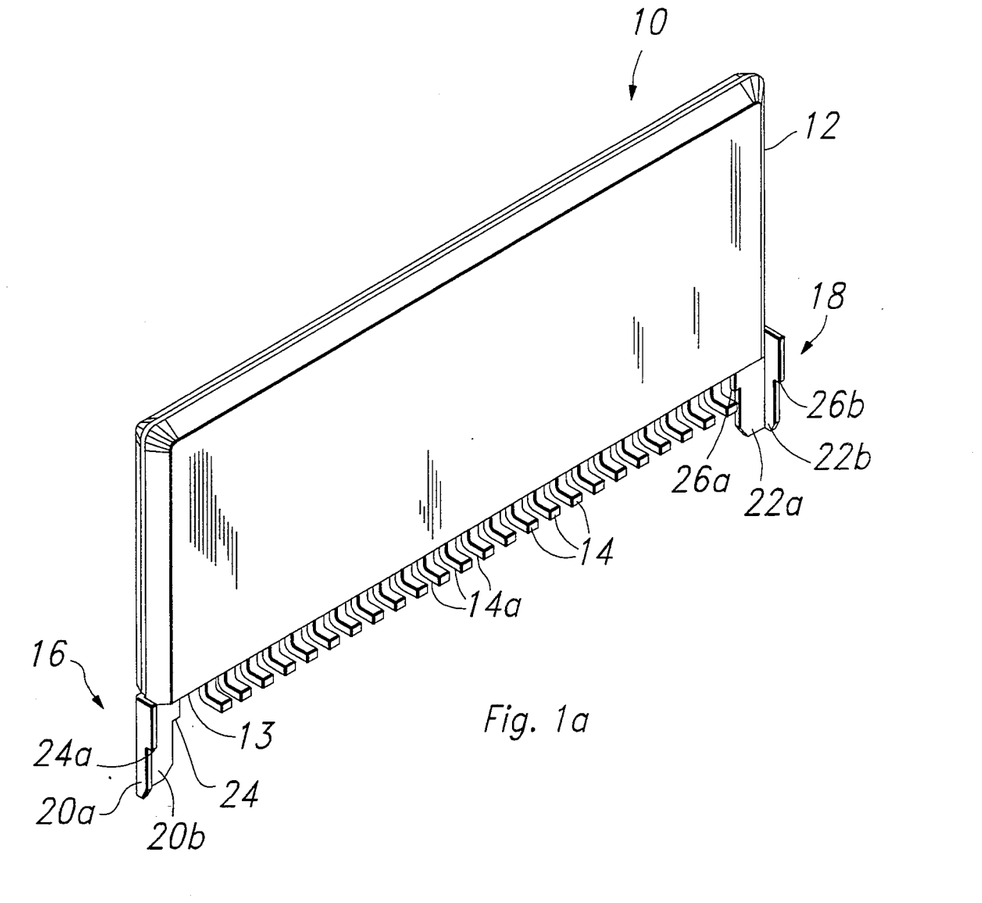
FIG. 1a is a perspective view of an integrated circuit device according to a first embodiment of the invention.

Referring to FIG. 1a of the drawings, an edge-mounted, surface-mount, packaged semiconductor device 10 is illustrated according to one embodiment of the invention. The device 10 includes an injection-molded flat plastic package 12, as is commonly used in this industry, that surrounds and contains a semiconductor die 11 (shown in FIG. 1b) to provide support and hermetic sealing. Device 10 also includes metal leads 14 that are electrically connected to circuitry in the semiconductor die and extend from an edge 13 of the package for connection to conductors on a circuit board or the like. Leads 14 are bent so that the bottom surfaces or faces 14a of the leads are generally parallel to edge 13 and perpendicular to flat package 12.

Metal lead frame supports 16 and 18 extend from package 12 for supporting device 10 in a vertical orientation prior to soldering leads 14 to printed circuit conductors. The mechanical support provided by lead frame supports 16 and 18 is sufficient so that when supports inserted into corresponding holes in a printed circuit board, no external means of support is required to hold device 10 in the desired vertical orientation before, during, and after solder fellow. Lead frame supports 16 and 18 have the same dimensions and are mirror images of one another. Lead frame support 16 includes orthogonal planar portions 20a and 20b for insertion into a first hole in a printed circuit board. Lead frame support 18 includes orthogonal planar portions 22a and 22b for insertion into a second hole in a printed circuit board. Planar portions 20b and 22a extend from edge 13.

Support 16 includes stop surfaces 24a and 24b and support 18 includes stop surfaces 26a and 26b. Stop surfaces 24a, 24b, 26a, and 26b are coplanar and are for contacting the surface of a printed circuit board to limit extension of lead frame supports 16 and 18 into holes in the printed circuit board in order to provide a selected spacing between edge 13 and the printed circuit board. Stop surfaces 24a, 24b, 26a, and 26b are positioned slightly closer to edge 13 than flat surfaces 14a of leads 14 so that when device 10 is mounted on a printed circuit board, leads 14 will be resiliently biased by printed circuit conductors. This insures a good electrical connection between leads 14 and the printed circuit conductors while preventing damage to leads 14.

Figure 1B:
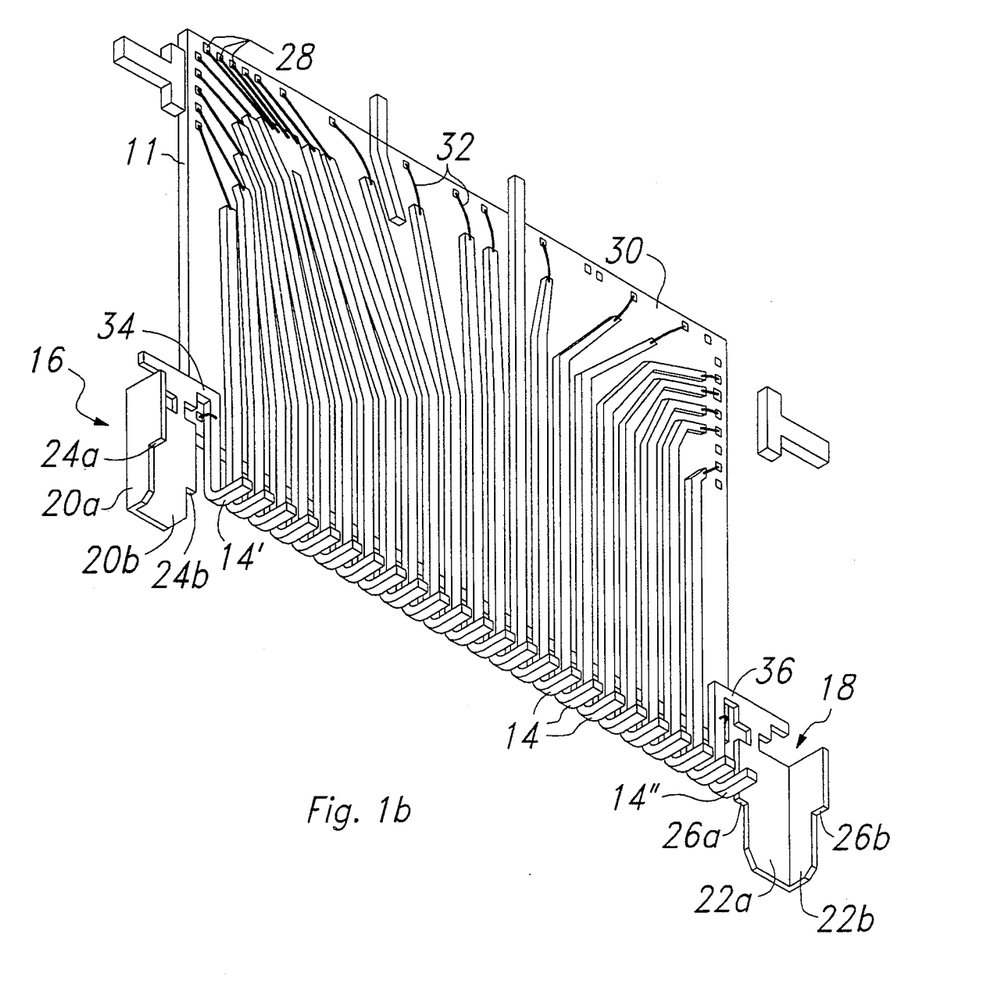
FIG. 1b shows the integrated circuit device of FIG. 1a with he plastic packaging removed.

FIG. 1b illustrates device 10 of FIG. 1a with plastic packaging 12 removed. Device 10 includes a semiconductor die 11 having bond pads 28 formed on surface 30 of die 11. Leads 14 are attached to surface 30 with an adhesive polyimide tape, for example. Wires 32 have one end bonded to lead 14 and another end bonded to a bond pad 28 to electrically connect leads 14 to circuitry in die 11. Support 16 is connected to an adjacent lead 14' by a lead frame bus 34. Support 18 is connected to an adjacent lead 14" by a lead frame bus 36. Other techniques for electrically connecting leads to circuitry on the die, such as soldering the leads directly to contact bumps on the die, may also be used.

Busses 34 and 36 could be severed to electrically isolate supports 16 and 18 from leads 14' and 14" in situations where additional input or output signal carrying capability to circuitry on die 11 is needed. In such situations, supports 16 and 18 would be separately wire bonded to associated bond pads on die 11 and inserted in and soldered to plated through-holes in a PC board.

Figure 1C:
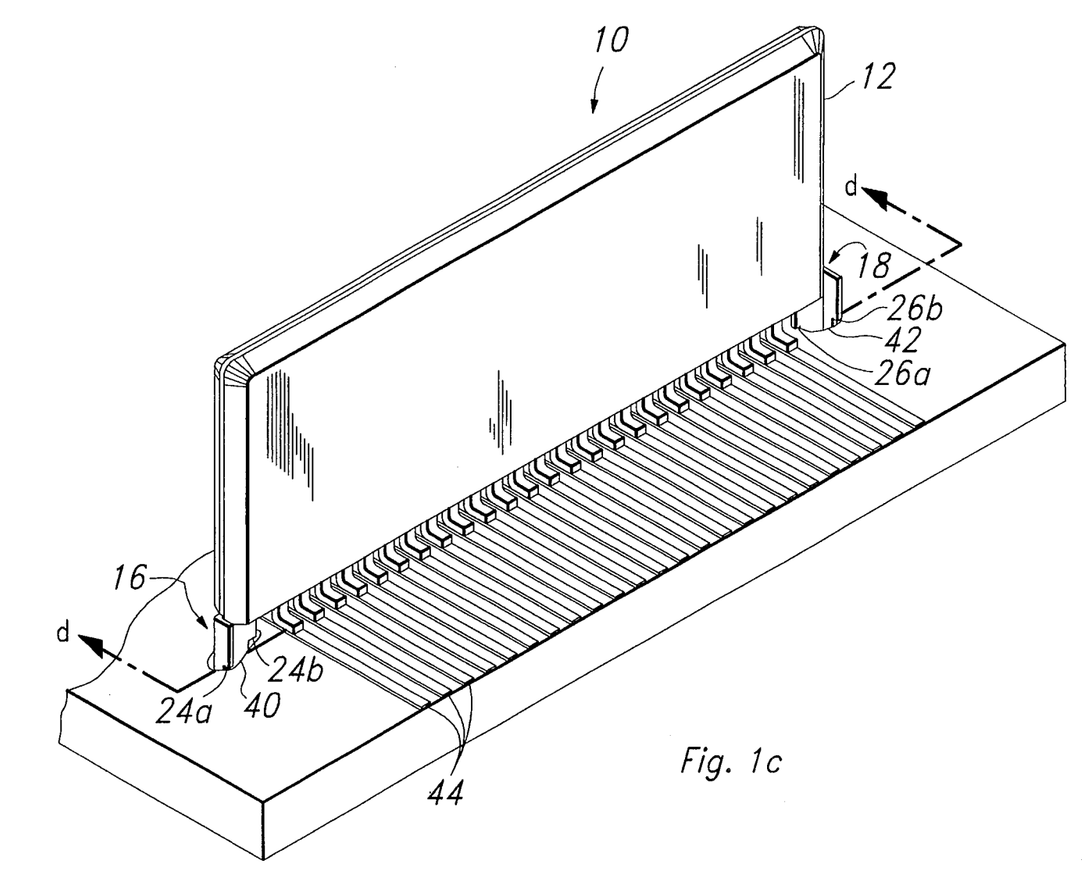
FIG. 1c is a perspective view of the device of FIG. 1a mounted on a printed circuit board.
Figure 1D:
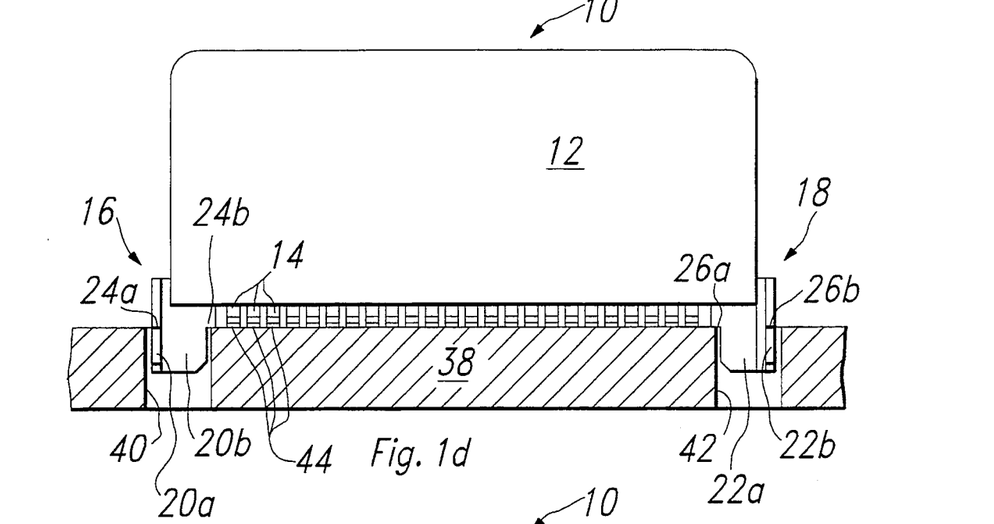
FIG. 1d is a front elevation view, partly in section, of the device of FIG. 1a mounted on a printed circuit board.

FIGS. 1c and 1d illustrate a circuit board assembly with device 10 mounted on a substrate or printed circuit board 38. PC board 38, shown in cross-section in FIG. 1d taken along section lines d—d of FIG. 1c, has through-holes or openings 40 and 42 and printed circuit conductors 44 formed on its upper surface between holes 40 and 42. The device 10 is mechanically supported by insertion of lead frame supports 16 and 18 into holes 40 and 42. Insertion of supports 16 and 18 into holes 40 and 42 also serves to correctly position device 10 in the x-y plane so that leads 14 are aligned with conductors 44. Stop surfaces 24a, 24b, 26a, and 26b contact the surface of PC board 20 to limit insertion of supports 16 and 18 into holes 40 and 42 to a depth at which leads 14 contact and are resiliently biased by printed circuit conductors 44 formed on the surface of the PC board. The diameters of holes 40 and 42 are chosen to provide sufficiently snug fits to supports 16 and 18 to stabilize device 10 in a vertical orientation prior to soldering leads 14 to conductors 44. Holes 40 and 42 may be plated and coupled to board ground, power, or other signal source and supports 16 and 18 soldered to the holes where additional input or output signal carrying capability to circuitry on die 11 is needed.

Although each of supports 16 and 18 is shown having a stop surface, it is understood that one or both of the stop surfaces on each support may be eliminated leaving the integrated circuit device supported by leads 14. This is especially true in situations where device 10 is light and the person or machine mounting the integrated circuit devices on circuit boards uses very little force to insert the studs into the circuit board holes.

Figure 1E:
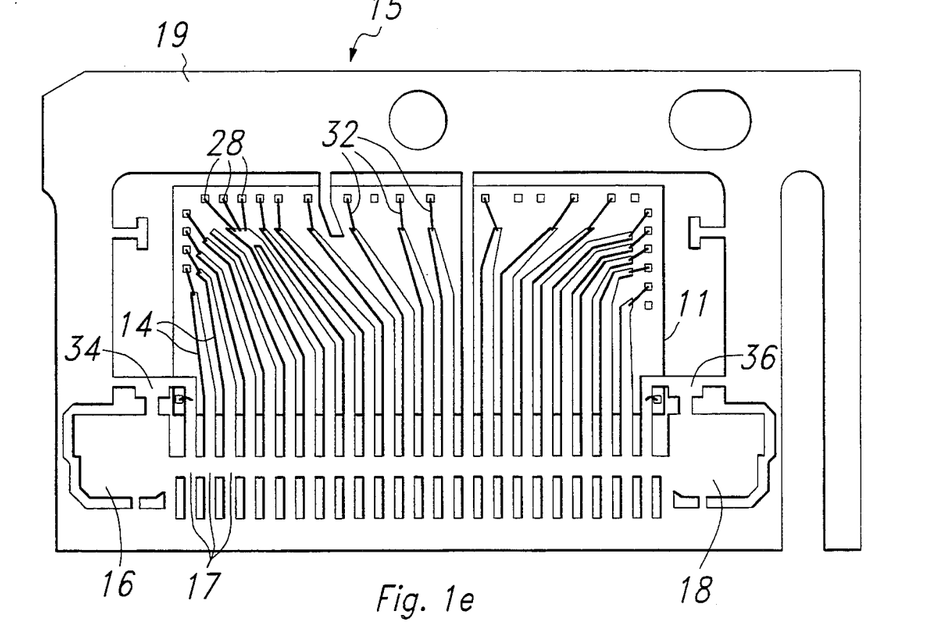
FIGS. 1e–1f illustrate the device of FIG. 1a at various stages in the manufacturing process.
Figure 1F:
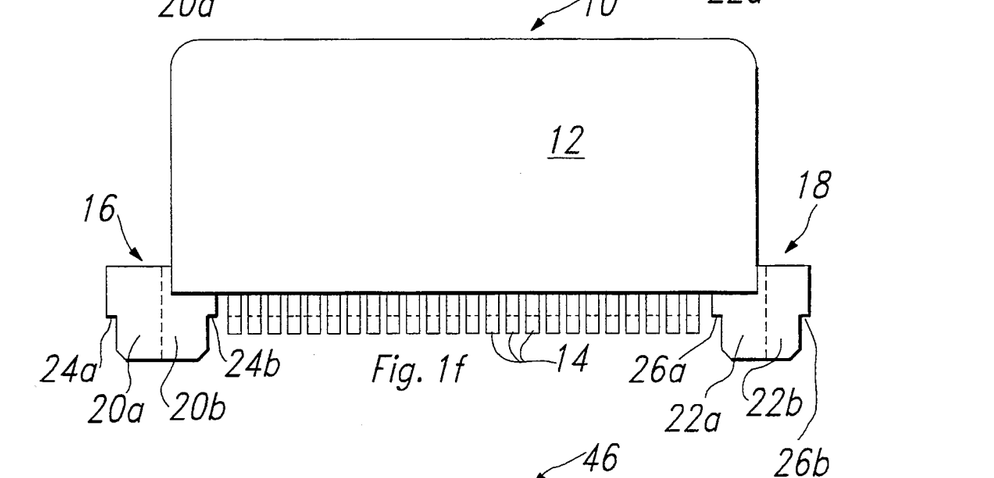

FIGS. 1e–1f illustrate device 10 at various stages in the manufacturing process. FIG. 1e illustrates the device after the initial steps of adhesively bonding leads 14 of lead frame 15 to die 11 and wire bonding wires 32 to bond pads 28 and leads 14 have been sequentially performed. Lead frame 15 includes web portions 17 that connect leads 14 and lead frame supports 16 and 18 and an outer rail 19 that surrounds an opening in which die 11 is positioned. FIG. 1f illustrates the device after the steps of encapsulating die 11 in plastic and trimming lead frame 15 to remove web portions 17 and outer rail 19 have been sequentially performed. An additional step of forming leads 14 and supports 16 and 18 by orthogonal bending along the dotted lines in FIG. 1f produces the completed device of FIG. 1a.

The use of supports 16 and 18 formed from lead frame material is advantageous in that no complex, expensive modifications to the mold used to form the encapsulating plastic package are required. In addition, since the lead frame is formed from a thin metal, the lead frame supports are sufficiently resilient to easily withstand the force of inadvertent bumping without breaking off. In response to such force, the device would be momentarily deflected slightly and then return substantially to its original position. Automatic soldering could take place without interruption to replace a damaged, tipped-over device. Further, since the lead frame is formed from a thin metal, the lead frame supports would be flexible enough to deform slightly to permit insertion in circuit board holes in situations where there is slight a misalignment between the support and hole. Supports 16 and 18 also contribute to cooling of device 10 by acting as heat radiators since they are formed from metal lead frame material, are bonded to die 11 within package 12, and extend outside of the package.

Figure 2A:
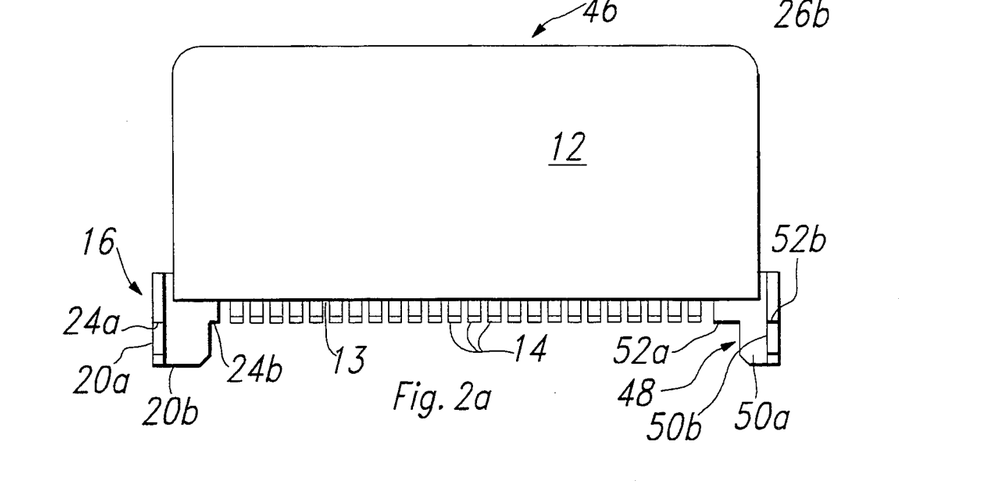
FIG. 2a is a front elevation view of an integrated circuit device according to a second embodiment of the invention.

Referring to FIG. 2a of the drawings, an edge-mounted, surface-mount, packaged semiconductor device 46 is illustrated according to another embodiment of the invention. The device 46 is identical to device 10 of FIG. 1a with the exception that a lead frame support 48 is provided in place of support 18. Lead frame support 48 includes orthogonal planar portions 50a and 50b for insertion into a hole in a printed circuit board. Planar portion 50a extends from edge 13. The width of portions 50a and 50b is less than that of portions 20a and 20b or port 16. As a result, portions 50a and 50b of support 48 will fit into a smaller diameter hole in a printed circuit board than portions 20a and 20b of support 16.

Support 48 also includes stop surfaces 52a and 52b for contacting the surface of a printed circuit board to limit extension of lead frame support 48 into a hole in the printed circuit board in order to provide a selected spacing between edge 13 and the printed circuit board. Stop surfaces 52a and 52b are coplanar with stop surfaces 24a and 24b and are positioned slightly closer to edge 13 than flat surfaces 14a of leads 14 so that when device 46 is mounted on a printed circuit board, leads 14 will be resiliently biased by printed circuit conductors.

Figure 2B:
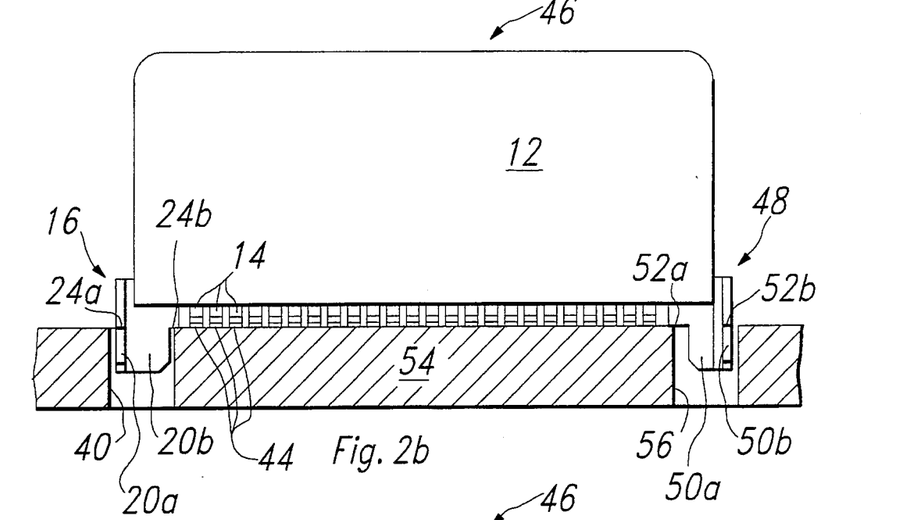
FIG. 2b is a front elevation view, partly in section, of the device of FIG. 2a mounted on a printed circuit board.

FIG. 2b illustrates a circuit board assembly with device 46 mounted on printed circuit board 54. PC board 54, shown in cross-section, has through-holes or openings 40 and 56 and printed circuit conductors 44 formed on its upper surface between holes 40 and 56. The device 46 is mechanically supported by insertion of lead frame supports 16 and 48 into holes 40 and 56, respectively. Stop surfaces 24a, 24b, 52a, and 52b contact the surface of PC board 54 to limit insertion of supports 16 and 48 into holes 40 and 56 to a depth at which leads 14 contact and are resiliently biased by printed circuit conductors 44 formed on the surface of the PC board. The diameters of holes 40 and 56 are chosen to provide sufficiently snug fits to supports 16 and 48 to stabilize device 46 in a vertical orientation prior to soldering leads 14 to conductors 44. In addition, the dimensions of portions 20a and 20b are sufficiently large to prevent portions 20a and 20b from being inserted into hole 56. This prevents device 46 from being mounted 180 degrees out of position and thereby insures that each of leads 14 is connected to the correct one of conductors 44 to receive appropriate signals. The possibility that device 46 could be mounted 180 degrees out of position so that leads 14 receive improper signals capable of damaging device 46 and other devices mounted on circuit board 54 is thus eliminated.

Although each of supports 16 and 48 is shown having stop surfaces, it is understood that one or both of the stop surfaces on each support may be eliminated leaving the integrated circuit device 46 supported by leads 14. This is especially true in situations where device 46 is light and the person or machine mounting the integrated circuit devices on circuit boards uses very little force to insert the studs into the circuit board holes.

Figure 2C:
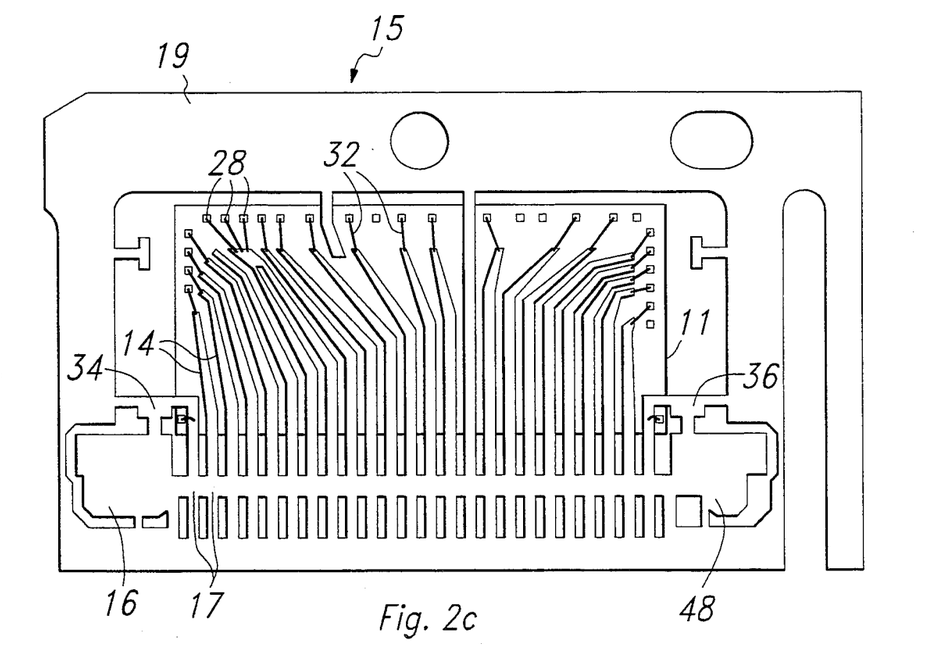
FIGS. 2c–2d illustrate the device of FIG. 2a at various stages in the manufacturing process.
Figure 2D:
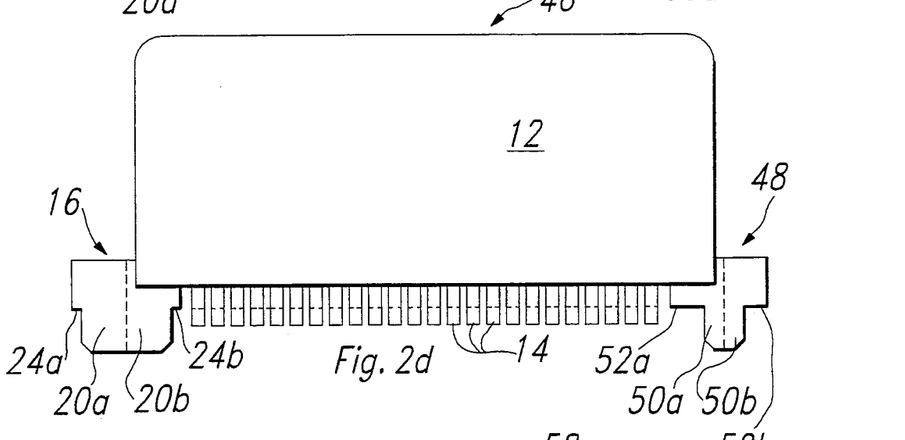

FIGS. 2c–2d illustrate device 46 at various stages in the manufacturing process. FIG. 2c illustrates the device after the initial steps of adhesively bonding leads 14 of lead frame 15 to die 11 and wire bonding wires 32 to bond pads 28 and leads 14 have been sequentially performed. Lead frame 15 includes web portions 17 that connect leads 14 and lead frame supports 16 and 48 and an outer rail 19 that surrounds an opening in which die 11 is positioned. Busses 34 and 36 could be severed to electrically isolate supports 16 and 48 from leads 14' and 14'' in situations where additional input or output signal carrying capability to circuitry on die 11 is needed. FIG. 2d illustrates the device after the steps of encapsulating die 11 in plastic and trimming lead frame 15 to remove web portions 17 and outer rail 19 have been sequentially performed. Following a final step of forming leads 14 and supports 16 and 48 by orthogonal bending along the dotted lines in FIG. 2d the completed device of FIG. 2a is produced.

Figure 3A:
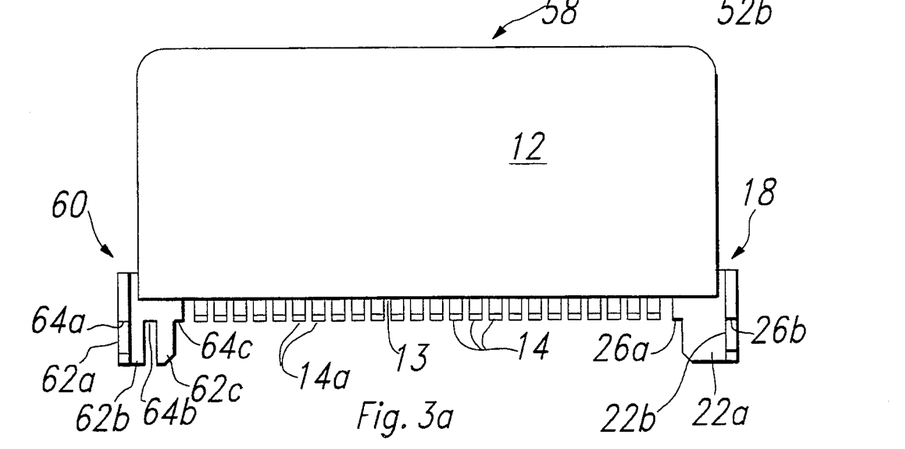
FIG. 3a is a front elevation view of an integrated circuit device according to a third embodiment of the invention.

Referring now to FIG. 3a of the drawings, an edge-mounted, surface-mount, packaged semiconductor device 58 is illustrated according to another embodiment of the invention. The device 58 is identical to device 10 of FIG. 1a with the exception that a lead frame support 60 is provided in place of support 16. Lead frame support 60 includes orthogonal planar portions 62a and 62b for insertion into a first hole in a printed circuit board. Lead frame support 60 also includes a planar portion 62c that is spaced from and coplanar with portion 62b for insertion into a second hole in a printed circuit board. Planar portions 62b and 62c extend from edge 13.

Support 60 also includes stop surfaces 64a, 64b, and 64c for contacting the surface of a printed circuit board to limit extension of lead frame support 60 into first and second holes in the printed circuit board in order to provide a selected spacing between edge 13 and the printed circuit board. Stop surfaces 64a, 64b, and 64c are coplanar with stop surfaces 26a and 26b and are positioned slightly closer to edge 13 than flat surfaces 14a of leads 14 so that when device 46 is mounted on a printed circuit board, leads 14 will be resiliently biased by printed circuit conductors.

Figure 3B:
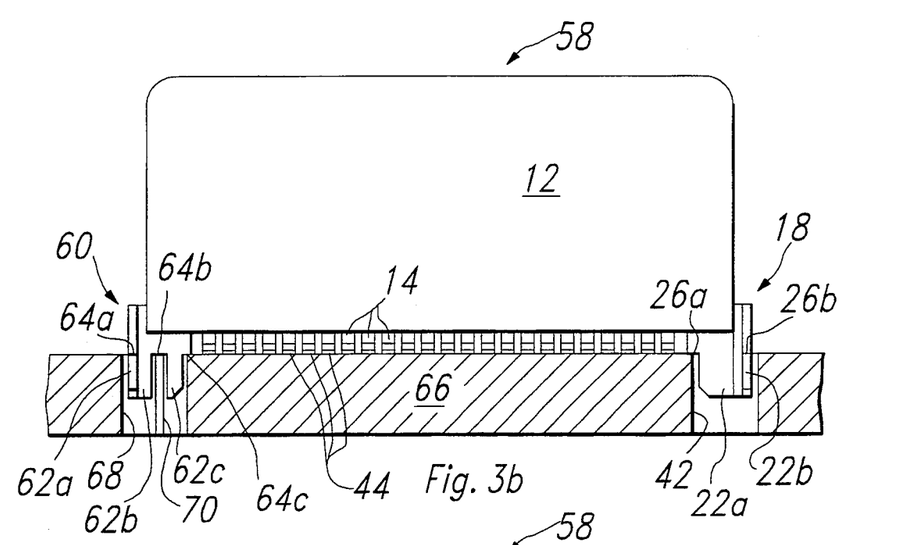
FIG. 3b is a front elevation view, partly in section, of the device of FIG. 3a mounted on a printed circuit board.

FIG. 3b illustrates a circuit board assembly with device 58 mounted on printed circuit board 66. PC board 66, shown in cross-section, has through-holes or openings 68, 70, and 42 and printed circuit conductors 44 formed on its upper surface between holes 70 and 42. The device 58 is mechanically supported by insertion of lead frame supports 60 and 18 into holes 68, 70, and 42. Portions 62a and 62b of support 60 are inserted into hole 68. Portion 62c of support 60 is inserted into hole 70. Stop surfaces 64a, 64b, 64c, 26a, and 26b contact the surface of PC board 66 to limit insertion of supports 60 and 18 into holes 68, 70, and 42 to a depth at which leads 14 contact and are resiliently biased by printed circuit conductors 44 formed on the surface of the PC board.

The diameters of holes 68 and 70 are chosen to provide snug fits to portions 62a, 62b, and 62c of support 60 while the diameter of hole 42 is chosen to provide a snug fit to portions 22a and 22b of support 18. The fits are sufficiently snug to stabilize device 46 in a vertical orientation prior to soldering leads 14 to conductors 44 without the need for any other means of support. In addition, the combined dimensions of portions 22a and 22b are larger than the diameter of either of holes 68 and 70 to prevent portions 22a and 22b of support 18 from being inserted into either of holes 68 or 70. This prevents device 58 from being mounted 180 degrees out of position and thereby insures that each of leads 14 is connected to the correct one of conductors 44 to receive appropriate signals. The possibility device 58 could be mounted 180 degrees out of position so that leads 14 receive improper signals capable of damaging device 58 and other devices mounted on circuit board 66 is thus eliminated.

Although each of supports 60 and 18 is shown having stop surfaces, it is understood that one or all of the stop surfaces on each support may be eliminated leaving the integrated circuit device 58 supported by leads 14. This is especially true in situations where device 58 is light and the person or machine mounting the integrated circuit devices on circuit boards uses very little force to insert the studs into the circuit board holes.

Figure 3C:
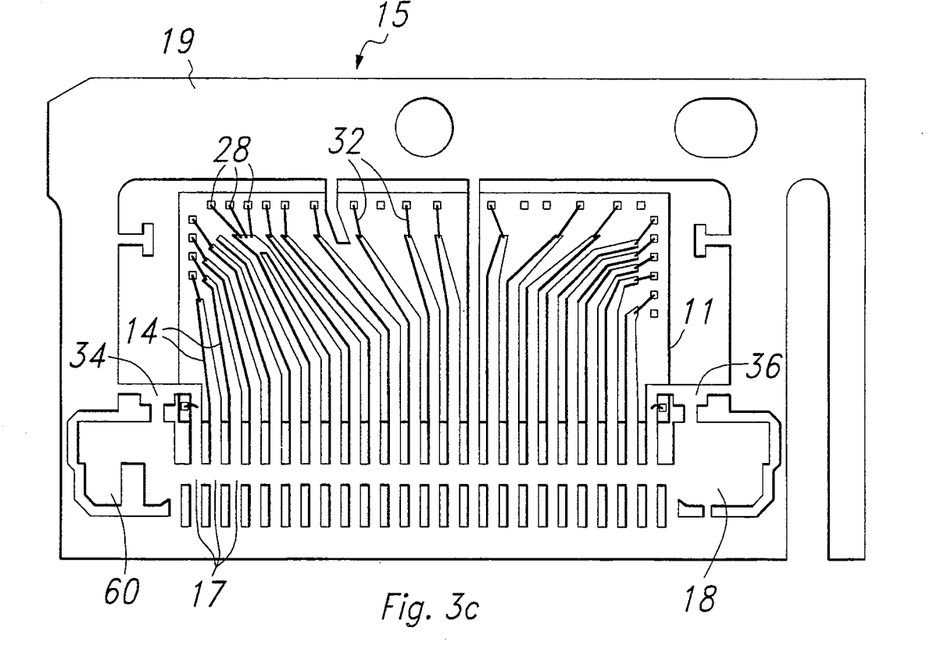
FIGS. 3c–3d illustrate the device of FIG. 3a at various stages in the manufacturing process.
Figure 3D:
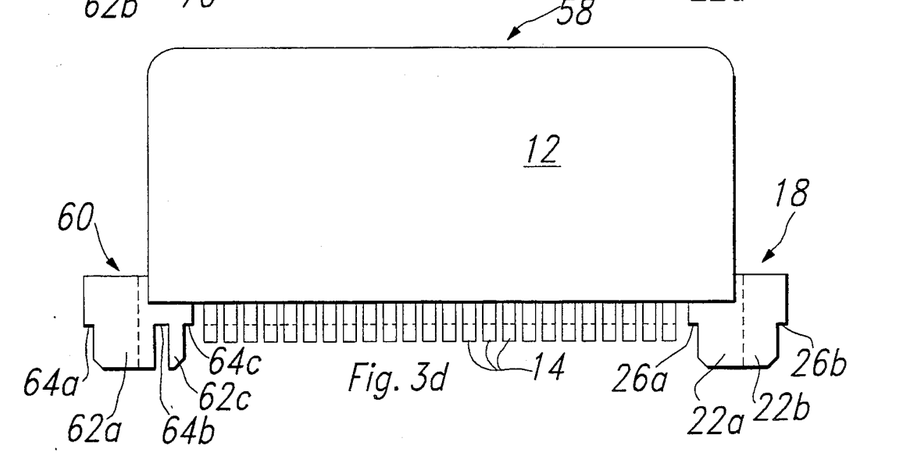

FIGS. 3c–3d illustrate device 58 at various stages in the manufacturing process. FIG. 3c illustrates the device after the initial steps of adhesively bonding leads 14 of lead frame 15 to die 11 and wire bonding wires 32 to bond pads 28 and leads 14 have been sequentially performed. Lead frame 15 includes web portions 17 that connect leads 14 and lead frame supports 60 and 18 and an outer rail 19 that surrounds an opening in which die 11 is positioned. Busses 34 and 36 could be severed to electrically isolate supports 60 and 18 from leads 14' and 14" in situations where additional input or output signal carrying capability to circuitry on die 11 is needed. FIG. 3d illustrates the device after the steps of encapsulating die 11 in plastic and trimming lead frame 15 to remove web portions 17 and outer rail 19 have been sequentially performed. Following a final step of forming leads 14 and supports 60 and 18 by orthogonal bending along the dotted lines in FIG. 3d the completed device of FIG. 3a is produced.

Figures 4A, 4B:
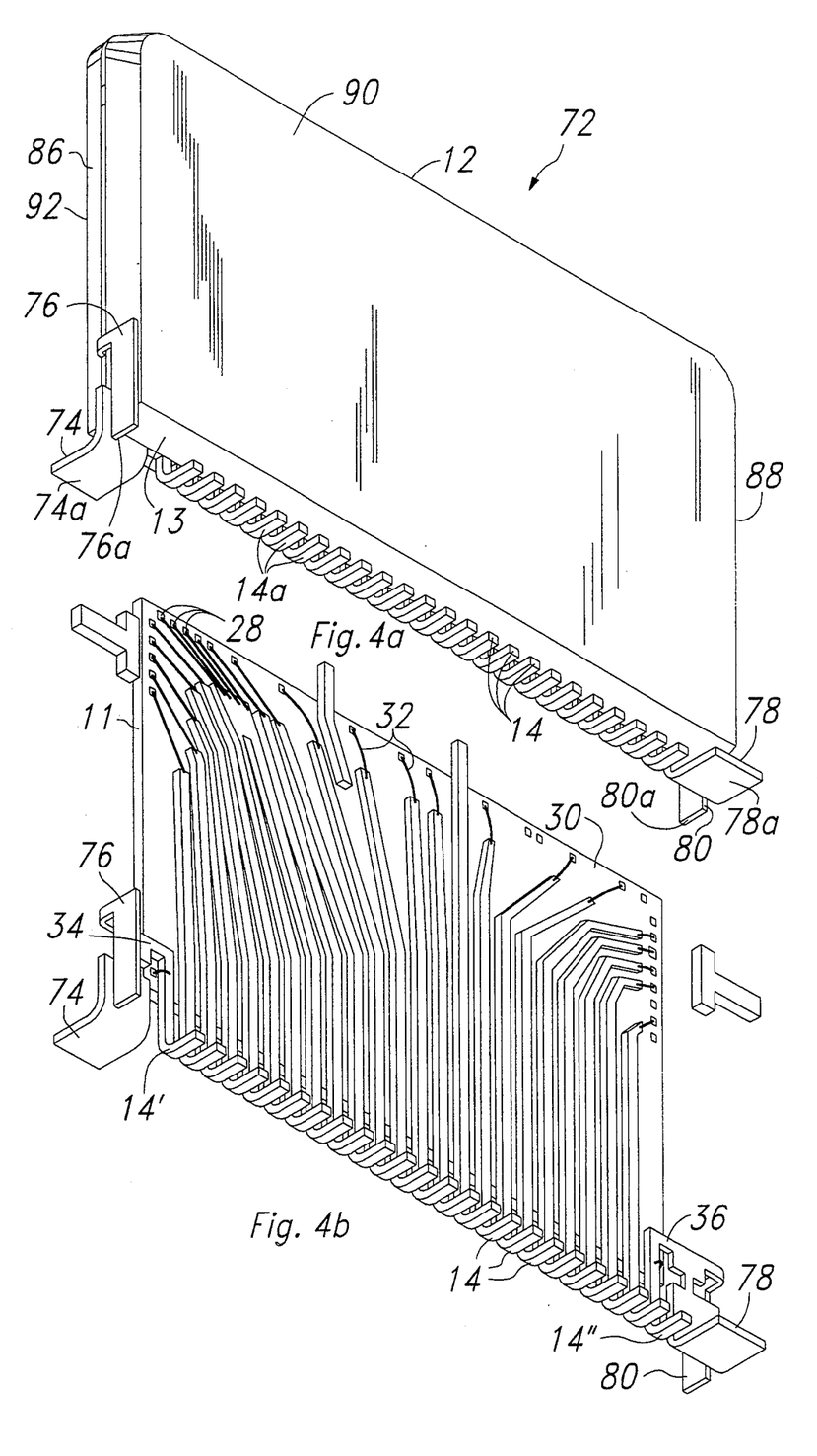
FIG. 4a is a front elevation view of an integrated circuit device according to a fourth embodiment of the invention.
FIG. 4b the integrated of FIG. 4a with the plastic packaging removed.

Referring now to FIG. 4a of the drawings, an edge-mounted, surface-mount, packaged semiconductor device 72 is illustrated according to another embodiment of the invention. Device 72 is completely surface-mountable requiring no holes in a PC board. The device 72 is identical to device 10 of FIG. 1a with the exception that surface-mount lead frame support 74 and anti-tilt support 76 are provided in place of through-hole mounted support 16 and surface-mount lead frame support 78 and anti-tilt support 80 are provided in place of through-hole mounted support 18. Supports 74 and 78 extend from edge 13 and are bent to present faces 74a and 78a perpendicular to package 12. Supports 76 and 80 extend from opposing side edges 86 and 88 of package 12. Side edges 86 and 88 are perpendicular to edge 13.

Support 78 is bent toward front side 90 of package 12 in the same direction as leads 14 while support 74 is bent in the opposite direction toward rear side 92 of package 12. Front and rear sides 90 and 92 are generally parallel to one another. The lengths and widths of supports 74 and 78 are chosen to be able to support the weight of device 72 to protect leads 14 from damage while orienting the device vertically without external assistance. Supports 74 and 78 are preferably longer and wider than leads 14. Anti-tilt supports 76 and 80 are bent in opposing directions to supports 74 and 78, respectively, to provide additional vertical stabilization. Supports 74, 76, 78, and 80 include surfaces 74a, 76a, 78a, and 80a, respectively, for contacting the surface of a printed circuit board to provide a selected spacing between edge 13 and the printed circuit board. Surfaces 74a, 76a, 78a, and 80a are coplanar and are positioned slightly closer to edge 13 than flat surfaces 14a of leads 14 so that when device 72 is mounted on a printed circuit board, leads 14 will be resiliently biased by printed circuit conductors.

FIG. 4b illustrates device 72 of FIG. 4a with plastic packaging 12 removed. Device 72 includes a semiconductor die 11 having bond pads 28 formed on surface 30 of die 11. Leads 14 are attached to surface 30 with an adhesive polyimide tape, for example. Wires 32 have one end bonded to a lead 14 and another end bonded to a bond pad 28 to electrically connect leads 14 to circuitry in die 11. Supports 74 and 76 are connected to an adjacent lead 14' by a lead frame bus 34. Supports 78 and 80 are connected to an adjacent lead 14" by a lead frame bus 36. Busses 34 and 36 could be severed to electrically isolate supports 74 and 76 and supports 78 and 80 from leads 14' and 14" in situations where additional input or output signal carrying capability to circuitry on die 11 is needed.

Figure 4C:
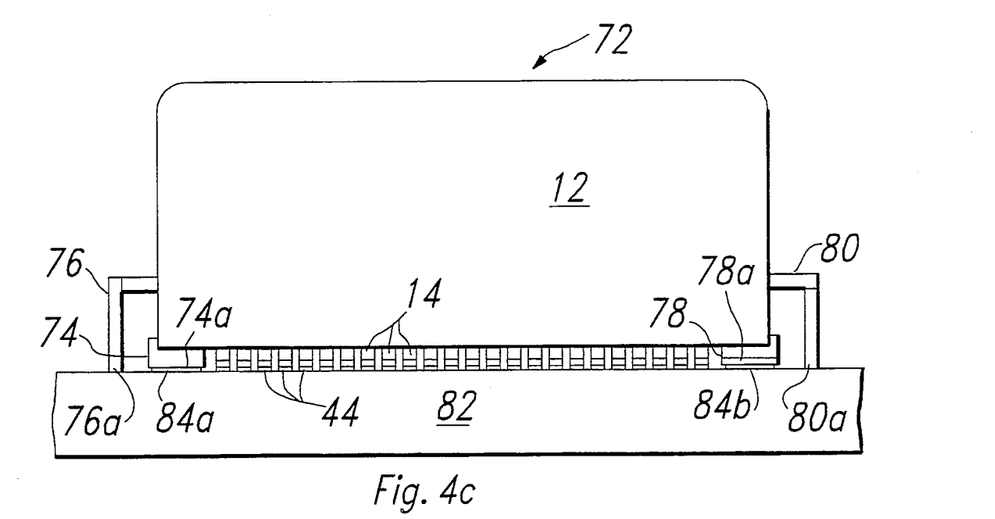
FIG. 4c is a front elevation view, partly in section, of the device of FIG. 4a mounted on a printed circuit board.

FIG. 4c illustrates a circuit board assembly with device 72 mounted on printed circuit board 82. PC board 82, shown in cross-section, has printed circuit conductors 44 formed on its upper surface that are soldered to leads 14 and printed circuit conductors 84a and 84b that are soldered to surfaces 74a and 78a, respectively. Prior to soldering, the device 72 is mechanically supported in a vertical position without external assistance by lead frame supports 74, 76, 78, and 80 contacting the surface of PC board 82. The tackiness of the solder paste screened onto the surface of PC board 82 prior to fellow soldering assists in holding leads 14 and supports 74 and 78 in contact with conductors 44, 84a, and 84b. Conductors 84a and 84b may be eliminated in situations Where the additional signal carrying capability they provide is not needed.

Figure 4D:
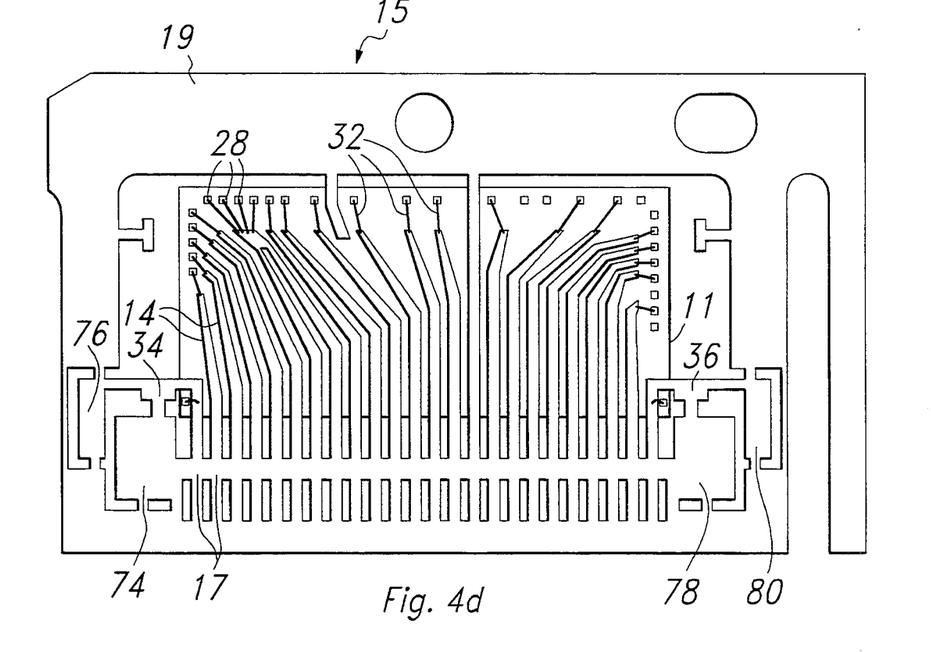
FIGS. 4d–4e illustrate the device of FIG. 4a at various stages in the manufacturing process.
Figure 4E:
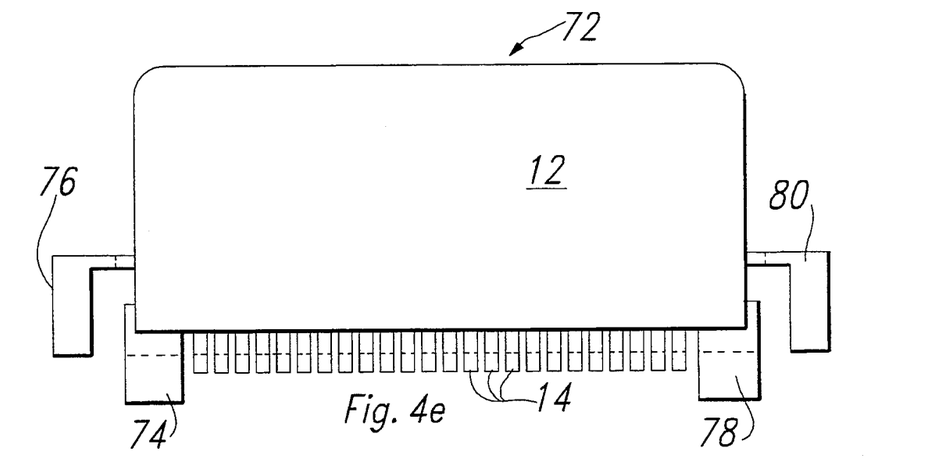

FIGS. 4d–4e illustrate device 72 at various stages in the manufacturing process. FIG. 4d illustrates the device after the initial steps of adhesively bonding leads 14 of lead frame 15 to die 11 and wire bonding wires 32 to bond pads 28 and leads 14 have been sequentially performed. Lead frame 15 includes web portions 17 that connect leads 14 and lead frame supports 74, 76, 78, and 80 and an outer rail 19 that surrounds an opening in which die 11 is positioned. FIG. 4e illustrates the device after the steps of encapsulating die 11 in plastic and trimming lead frame 15 to remove web portions 17 and outer rail 19 have been sequentially performed. Following a final step of forming leads 14 and supports 74, 76, 78 and 80 by orthogonal bending along the dotted lines in FIG. 4d the completed device of FIG. 4a is produced.

One or both of anti-tilt supports 76 and 80 could be eliminated in situations where the additional stabilization they provide is unnecessary, for example, where the height of device 76 is small.

A few preferred embodiments have been described in detail hereinabove. It is to be understood that the scope of the invention also comprehends embodiment different from those described, yet within the scope of the claims.

For example, different numbers and shapes of lead frame supports may be used; the lead frame supports may be formed by techniques other than folding, such as rolling, coining, or lancing; the lead frame supports may include two portions that are oriented at angles greater or less than 90 degrees; and packaging material other than plastic, such as ceramic, may be used.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed:

1. An edge-mounted integrated circuit device, comprising:
   a semiconductor die;
   a lead frame attached to said semiconductor die, said lead frame including a plurality of leads and at least one support, said leads electrically connected to said semiconductor die;
   a package encapsulating said semiconductor die and a portion of said lead frame, each of said leads extending from an edge of said package and bent to present a face for surface-mount connection to a conductor on a substrate, said at least one support extending from said package for insertion into an opening in the substrate to support said edge-mounted integrated circuit device in position for soldering said faces of said leads to the conductors on the substrate.

2. The integrated circuit device of claim 1 in which said package is flat and said leads are bent to present a face generally perpendicular to said flat package.

3. The integrated circuit device of claim 1 in which said at least one support includes first and second supports.

4. The integrated circuit device of claim 3 in which said first and second supports extend from said edge, said leads being located between said first and second supports.

5. The integrated circuit device or claim 3 in which said first and second supports have different dimensions for insertion into first and second openings, respectively, of different dimensions in the substrate.

6. The integrated circuit device of claim 1 in which said at least one support includes first and second portions formed at an angle to one another.

7. The integrated circuit device of claim 1 in which said at least one support includes a stop surface for limiting extension of said at least one support into the substrate to provide a selected spacing between said edge of said package and the substrate.

8. The integrated circuit device of claim 1 in which said at least one support includes first and second spaced apart portions extending from said edge, said first portion for insertion into a first opening in the substrate, said second portion for insertion into a second opening in the substrate spaced from the first opening.

9. The integrated circuit device of claim 1 in which said at least one support includes first, second, and third portions, said first and second portions formed at an angle to one another, said first portion extending from said edge, said third portion extending from said edge and spaced from said first portion, said first and second portions for insertion into a first opening in the substrate, said third portion for insertion into a second opening in the substrate spaced from the first opening.

10. The integrated circuit device of claim 9 in which said first and third portions of said first support are connected by a stop surface for limiting for limiting extension of said at least one support into the substrate to provide a selected spacing between said edge of said package and the substrate.

11. The integrated circuit device of claim 1 in which said package is composed of plastic molded around said semiconductor die.

12. The integrated circuit device of claim 1 in which said at least one support is electrically connected to said semiconductor die.

13. An edge-mounted integrated circuit device, comprising:
    a semiconductor die;
    a lead frame attached to said semiconductor die, said lead frame including a plurality of leads, a first support, and a second support, said leads electrically connected to said semiconductor die;
    a package encapsulating said semiconductor die and a portion of said lead frame, each of said leads extending from a first edge of said package and bent to present face for surface-mount connection to a conductor on a substrate, each of said first and second supports extending from said package and bent to present a face for contacting the substrate to support said integrated circuit device in position for soldering said faces of said leads to the conductors on the substrate, said first support and said second support being bent toward opposite sides of said package.

14. The integrated circuit device of claim 13 in which said leads are located between said first and second supports.

15. The integrated circuit device of claim 13 in which said leads have a first width and said first and second supports have a second width, said first width being less than said second width.

16. The integrated circuit device of claim 13 in which said leads extend from said package a first distance and said first and second supports extend from said package a second distance, said second distance being greater than said first distance.

17. The integrated circuit device of claim 13 in which said package is composed of plastic molded around said semiconductor die.

18. The integrated circuit device of claim 13 in which said at least one of said first and second supports is electrically connected to said semiconductor die.

19. The integrated circuit device of claim 13 in which said package is flat and each of said leads, said first support, and said second support is bent to present a face generally perpendicular to said flat package.

20. The integrated circuit device of claim 13 in which said package includes second and third edges formed at an angle to said first edge, said first and second supports extending from said first edge, said lead frame further including a third support extending from said second edge adjacent said first support and a fourth support extending from said third edge adjacent said second support, said third and fourth supports for contacting the substrate to support said integrated circuit device in position for soldering said faces of said leads to the conductors on the substrate, said first and third supports being bent toward opposite sides of said package and said second and fourth supports being bent toward opposite sides of said package.

21. A circuit board assembly, comprising:
a circuit board including a surface, an opening in said surface, and a plurality of conductors formed on said surface;
an edge-mounted integrated circuit device mounted on said circuit board, said edge-mounted integrated circuit device including:
  a semiconductor die;
  a lead frame attached to said semiconductor die, said lead frame including a plurality of leads and at least one support, said leads electrically connected to said semiconductor die;
  a package encapsulating said semiconductor die and a portion of said lead frame, each of said leads extending from an edge of said package and bent to present a face surface-mount connected to an associated one of said conductors on said circuit board, said at least one support extending from said package and inserted into said opening in said circuit board to support said edge-mounted integrated circuit device.

22. A circuit board assembly, comprising:
a circuit board including a surface and a plurality of conductors formed on said surface;
an edge-mounted integrated circuit device mounted on said circuit board, said edge-mounted integrated circuit device including:
  a semiconductor die;
  a lead frame attached to said semiconductor die, said lead frame including a plurality of leads, a first support, and a second support, said leads electrically connected to said semiconductor die;
  a package encapsulating said semiconductor die and a portion of said lead frame, each of said leads extending from a first edge of said package and bent to present a face for surface-mount connection to an associated one of said conductors on said circuit board, each of said first and second supports extending from said package and bent to present a face contacting said surface of said circuit board to support said integrated circuit device, said first support and said second support being bent toward opposite sides of said package.

* * * * *